(12) United States Patent
Nagasaka et al.

(10) Patent No.: US 7,027,381 B1
(45) Date of Patent: Apr. 11, 2006

(54) LASER DRAWING APPARATUS, LASER DRAWING METHOD, A MASTER FOR MANUFACTURING HOLOGRAM, AND MANUFACTURING METHOD THEREOF

(75) Inventors: Kimio Nagasaka, Nirasaki (JP); Hiroyasu Kaseya, Suwa (JP); Akira Miyamae, Fujimi-machi (JP)

(73) Assignee: Seiko Epson Corporation, (JP)

( * ) Notice: Subject to any disclaimer, the term of this patent is extended or adjusted under 35 U.S.C. 154(b) by 1078 days.

(21) Appl. No.: 09/707,217

(22) Filed: Nov. 6, 2000

(30) Foreign Application Priority Data

| Nov. 4, 1999 | (JP) | ................................. 11-313865 |
| Mar. 29, 2000 | (JP) | ............................ 2000-092515 |
| Aug. 31, 2000 | (JP) | ............................ 2000-263757 |

(51) Int. Cl.
*G11B 7/00* (2006.01)
(52) U.S. Cl. ................. 369/275.1; 369/47.1; 369/44.14
(58) Field of Classification Search ............. 369/275.1, 369/275.4, 272, 47.1, 47.12, 47.15, 47.46, 369/53.1, 53.2, 59.1, 59.25, 44.14, 44.27, 369/103, 112.01
See application file for complete search history.

(56) References Cited

U.S. PATENT DOCUMENTS 6,322,933 B1 * 11/2001 Daiber et al. ................ 369/103
6,507,557 B1 * 1/2003 Ohno et al. ............... 369/275.3

FOREIGN PATENT DOCUMENTS

| JP | 59-171119 | 9/1984 |
| JP | 2-304569 | 12/1990 |
| JP | 6-77104 | 3/1994 |
| JP | 08-272110 | 10/1996 |
| JP | 10-011814 | 1/1998 |
| JP | 10-031314 | 2/1998 |
| JP | 10-104407 | 4/1998 |

OTHER PUBLICATIONS

Recording of computer-generated holograms on an optical disk master; Toyohiko Yatagai, Jose G. Camacho-Basilio, and Hajime Onda, Applied Optics, vol. 28, No. 6, Mar. 15, 1989.
Communication from Japanese Patent Office regarding counterpart application.

* cited by examiner

*Primary Examiner*—Muhammad Edun
(74) *Attorney, Agent, or Firm*—Harness, Dickey & Pierce, P.L.C.

(57) ABSTRACT

The laser patterning device of this invention comprises a turntable on which is placed a processed member, and which rotates the member; a linear slider; a laser serving as a light source; an optical system, mounted on the slider, which condenses the laser light to form a laser spot on a substrate; and an optical modulator which changes the optical intensity of the laser spot. By performing laser patterning of a prescribed pattern on the processed member while moving the optical system mounted on the slider, while rotating the processed member by means of the turntable, a pattern having fine gray scales in the depth direction can be drawn with high precision and in a short amount of time.

32 Claims, 13 Drawing Sheets

SAMPLING INFORMATION GENERATION

LASER DRAWING APPARATUS, LASER DRAWING METHOD, A MASTER FOR MANUFACTURING HOLOGRAM, AND MANUFACTURING METHOD THEREOF

BACKGROUND OF THE INVENTION

1. Field of the Invention

This invention concerns laser patterning or laser drawing technology used in various kinds of micromachining processes for semiconductor manufacture, hologram manufacture and other activities. This invention also concerns a hologram master for the reproduction of color three-dimensional images and technology for manufacture of same.

2. Description of the Related Art

FIG. 23 shows a drawing of the principle of a conventional Lippmann-type hologram. A Lippmann-type hologram is also called a volume hologram, and is recording material with interference fringes recorded on the inside in the thickness direction. A Lippmann-type hologram can utilize its superior color selectivity and angular selectivity to control the phase of light passing through the hologram interior, to control transmission and reflection of specific colors of light, and to cause transmitted light to converge in an arbitrary direction or to control reflection of light incident from a specific direction, apart from recording of three-dimensional images. It can also be used as an optical element having the functions of filters and lenses.

As shown in the drawing, the apple 81, as the object, is placed at an appropriate distance from the photographic plate 60. After passing through the shutter 35, the beam emitted from the gas laser 36 is condensed by the objective lens 33, and is rendered a parallel beam by the collimating lens 31. Thereafter it is divided by the half-mirror 66, with part irradiating the apple 81, and the reflected light arriving at the photographic plate 60 as a signal wave 63. The other part is reflected by the mirror 61 and arrives at the photographic plate 60 as a reference wave 64.

The thickness of the recording material layer of the photographic plate 60 is several tens of times the wavelength of the beam emitted by the gas laser 36. In the case of the optical system shown in the figure, the reference wave 64 and signal wave 63 are incident from opposite directions, so that interference fringes are nearly parallel to the surface of the photographic plate 60, diffraction efficiency is high, and a hologram with prominent wavelength selectivity is obtained.

Generally, in order to use optical lithography to manufacture the master or similar to obtain relief-type holograms, a photomask fabrication process, exposure process, development process, and etching process are necessary. In the photomask fabrication process, an XY table-type laser patterning device, shown in FIG. 22, is used. In this figure, the processed member 1104 is photoresist which is the object of laser patterning, applied to a prescribed thickness on glass substrate.

In an XY table-type laser patterning device, two orthogonal sliders 1102, 1103 are driven to move the processed member 1104 placed on the XY table 1101 in the X-direction and Y-direction, while causing laser light 112 to be transmitted through the electrooptical modulator 103 and acoustooptical modulator 102, reflected by the mirror 104, condensed by the objective lens 105 to form a laser spot on the processed member 1104, to draw the prescribed pattern in order to form the photomask.

Normally, each pixel of the photomask assumes one of two levels, either transparent or opaque. If the depth of the hologram is assumed to be eight levels, then because $8=2^3$, a combination of at least three photomasks is necessary. In the exposure process, a photomask obtained by the above photomask fabrication process is placed in close contact with quartz substrate coated with photoresist, for exposure from above. When there are three photomasks, exposure is performed three times, changing the quantity of light from the light source.

Thereafter development is performed, and the height of each pixel deepens according to the amount of light in the three exposures. Next the photoresist is used as a mask to etch the quartz substrate, transferring the pattern of the photoresist to the quartz substrate, to obtain a hologram master.

However, in the above photomask fabrication process, when a pattern is drawn using an XY table-type laser patterning device, if there is a large number of pixels the number of slider motions in the XY directions and the number of accelerations and decelerations increase, with the inexpedient result that drawing time is increased.

Further, when the interior of a pattern is filled in there are numerous repetitive motions, and during high-speed operation a considerable load is applied to the linear motor, while at the same time the reactive force during acceleration and deceleration of the X-Y table itself becomes a source of vibrations, so that positional precision and velocity precision are decreased.

In Japanese Patent Application Laid-Open No. S59-171119 is disclosed technology for high-speed patterning through disc rotation and the linear motion of an optical system; but there is no disclosure of a method to improve the drawing position precision or the resolution of the drawn pattern.

In Japanese Patent Application Laid-Open No. H10-11814 is disclosed a method for formation of a display pattern to display desired characters or similar, by converting the original-image data expressed in an X-Y coordinate system into an R-θ coordinate system. But there is no disclosure of technology for the highly precise drawing in a short length of time of a pattern having minute gray scales in the depth direction.

Further, the fabrication of a plurality of photomasks is necessary, and in the exposure process also alignment and exposure steps in a number equal to the number of photomasks are required, so that manufacturing time and cost are both increased considerably.

In the Lippmann-type hologram shown in FIG. 23, the signal wave 63 and reference wave 64 must interfere, and so ambient light, fluorescent light, and other general lighting are not suitable as the light source. Hence the object must be placed in a darkroom in which ambient light is shut out, so that buildings in ambient lighting are not suitable as objects. And, because the laser light must irradiate the entire object, large articles are not suitable as objects.

In the article by T. Yatagai et al. appearing in Appl. Opt., 28, 1042–1043 (7989) is disclosed binary-level CGH fabrication technology which employs a control system combining the rotation of a turntable and the linear motion of a slider; but there is no disclosure of multilevel CGH fabrication technology having a plurality of phase values.

SUMMARY OF THE INVENTION

This invention was devised in light of the above problems; an object of the invention is to provide a laser patterning device and laser patterning method for drawing, with high precision and in a short amount of time, patterns having minute gray scales in the depth direction.

Another object of this invention is to easily create holograms which have as objects large articles such as buildings, without being limited to small articles such as apples.

In order to resolve the above problem, a laser patterning device of this invention comprises a turntable on which a processed member is placed and which rotates the member; a linear slider; a laser serving as a light source; an optical system which condenses the laser light to form a laser spot on a substrate and which is placed on the slider; and an optical modulator to vary the optical intensity of the laser spot. The processed member is rotated by means of the turntable, and laser patterning of the prescribed pattern on the processed member is performed while moving the optical system mounted on the slider.

Through this configuration, by moving the laser spot linearly while rotating the processed member, a pattern having minute gray scales in the depth direction can be drawn with high precision and in a short amount of time.

It is preferable that the above configuration further comprise a formatter, comprising an oscillator to generate a reference signal in order to synchronize the turntable rate of revolution with optical modulator control signals; a storage device to record digital data corresponding to the output values of the optical modulator control signals; and a converter to convert the above digital data into analog signals.

By means of this configuration, exposure dose data is stored in advance in the storage device, and by reading this exposure dose data sequentially while converting it into analog data, and maintaining synchronization with the turntable rotation, laser beam modulation can be performed.

A laser patterning device of this invention comprises a turntable on which the processed member is placed and which rotates the member; a linear slider; a laser serving as a light source; an optical system, mounted on the slider, which condenses laser light on the above processed member to form a laser spot; sampling coordinate generation means to generate sampling coordinates while sequentially changing the radius from the center of rotation and the rotation angle of the turntable; sampling information generation means to generate sampling information corresponding to specific physical quantities representing the state at sampling coordinate positions; and exposure dose control means to control the exposure dose of the above laser spot using the sampling information.

Through this configuration, the exposure dose of the laser spot at each sampling point is calculated in realtime during exposure processing, so that the need to store exposure dose data in advance in a storage device is eliminated.

In the hologram master of this invention, a plurality of hologram regions to reproduce images resulting from analysis into each color component of a three-dimensional color image are positioned on the same substrate. The above color components are, for example, red, green, and blue. A hologram can be fabricated by copying an image reproduced based on the above hologram master onto hologram recording media.

DESCRIPTION OF THE PREFERRED EMBODIMENTS

Below, aspects of embodiments of this invention are explained with reference to the drawings.

Embodiment 1 of the Invention

Figure 1:
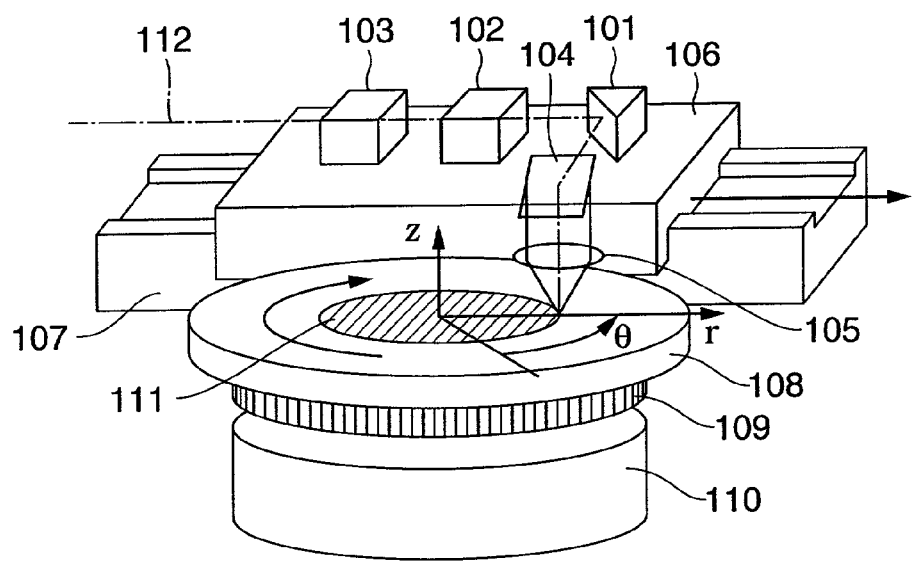
FIG. 1 is a diagram of the configuration of a laser patterning device of this invention.

FIG. 1 shows the configuration of a laser patterning device. In the figure, the laser light 112 emitted from a gas laser or solid-state laser passes through an electrooptical modulator 103 to remove laser noise and an acoustooptical modulator 102, the transmittance of which changes according to the drawing pattern. Thereafter the laser light 112 is reflected by the mirrors 101, 104, is condensed by the objective lens 105 to become a laser spot, and irradiates the photoresist laser 111 formed on the surface of the glass master plate 108. Through the action of this light, a latent image is formed in the photoresist 111, to draw a pattern.

Figure 2:
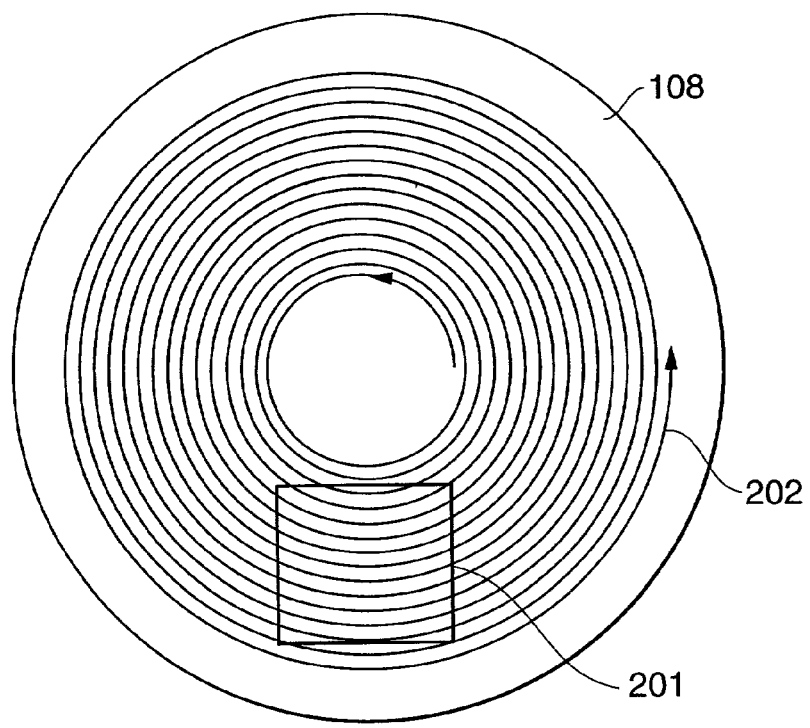
FIG. 2 is a diagram which explains laser patterning in a hologram region.

Normally, the higher the optical intensity of the laser spot, the deeper the latent image is formed. As time passes, the table 106 moves in the r direction, that is, from inner circumferences to outer circumferences of the glass master plate 108, on the slider 107. The glass master plate 108 is fixed by vacuum suction to the turntable 109, and rotates under the driving force of the spindle motor 110 as shown in FIG. 2. Through this operation, the trajectory 202 of the laser spot irradiating the photoresist layer 111 is a spiral shape. A single circumference of this trajectory is here called a track. The laser spot exposes the interior of the hologram region 201.

The method of rotation control of the spindle motor 110 during draw operations is not stipulated in particular, but control should be exercised such that the rotation rate is always constant (constant angular velocity). In this case, the speed with which the laser spot scans the photoresist layer 111 is faster in proportion to the distance between the laser spot and the center of rotation (the radius). In order to obtain a uniform exposure dose on the glass master plate 108, the intensity of the laser spot must be increased in proportion to the speed with which the laser spot scans the glass master plate. The electrooptical modulator 103 performs this control, and has the function of varying the transmitted light intensity of the laser light 112 according to the radius.

Figure 4:
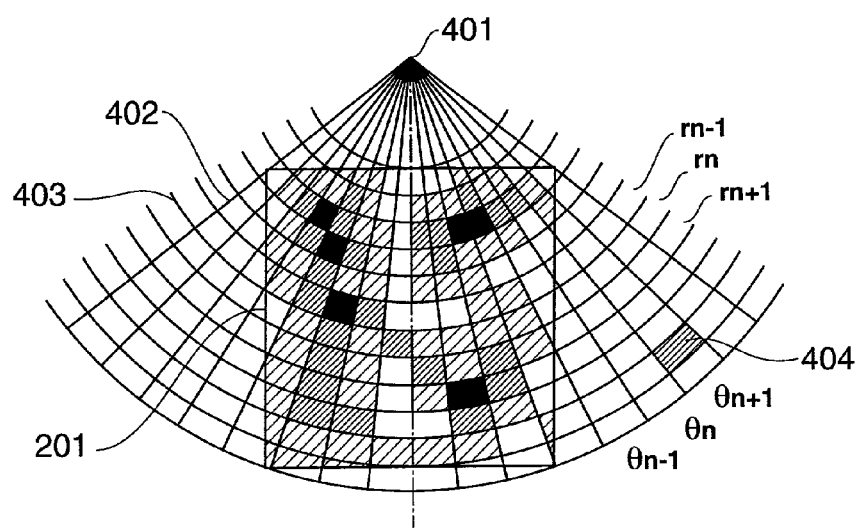
FIG. 4 is a diagram which explains laser patterning in a hologram region.

Here a case is considered in which a pattern like that shown in FIG. 4 is drawn in the hologram region 201. The pixels 404 comprised by the pattern are delineated by a plurality of line segments 402 extending in the radial direction from the center of rotation 401, and a plurality of arcs 403. The hatching density of each pixel in the hologram region 201 represents the depth; higher densities denote greater depth. When the photoresist applied to the glass master plate 108 is the positive type, during development the exposed parts are dissolved and concave shapes are formed; these areas are deeper for larger exposure doses.

Hence the electrooptical modulator 103 is controlled such that exposure doses are greater for pixels with greater densities, and are smaller for pixels with smaller densities. The dot formed in each pixel may be formed by a single laser pulse; or, when the laser spot diameter is small compared with the pixel, it may be formed by a plurality of laser pulses.

Figure 3:
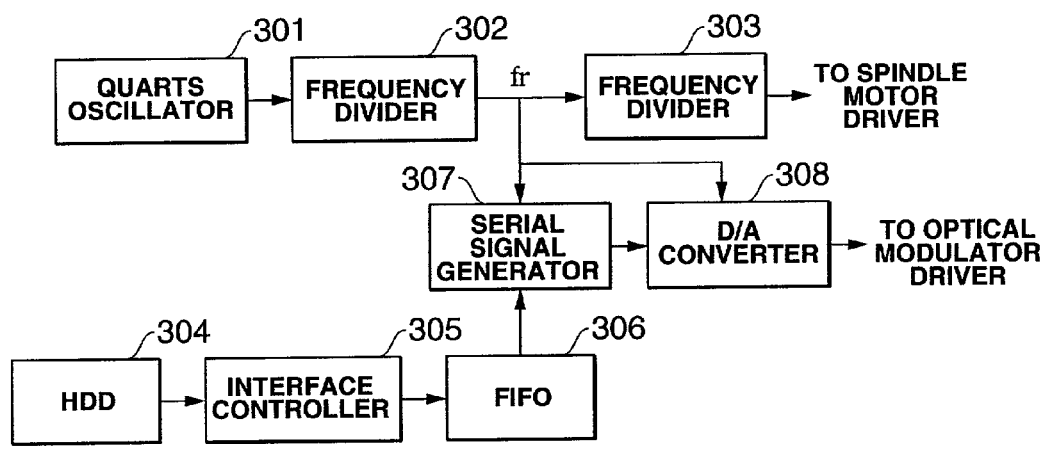
FIG. 3 is a functional block diagram of the formatter of a laser patterning device of this invention.

The electrooptical modulator 103 is generally driven according to control signals input to an optical modulator driver. FIG. 3 is a functional block diagram of the formatter which supplies control signals to this optical modulator driver. This formatter is synchronized with the spindle motor, and supplies a voltage level corresponding to the depth of each pixel to the optical modulator driver with highly precise timing.

Clock signals supplied from a quartz oscillator 301 are divided by a frequency divider 302, and after division the clock signal frequency becomes the reference frequency fr of the serial signal generator 307. The clock signal of this reference frequency fr is further divided by the frequency divider 303, becoming a reference signal for control of the rotation rate of the spindle motor, and is supplied to the spindle motor driver.

Values (data) corresponding to exposure doses for each pixel are recorded on a hard disk 304, in the order of exposure. This data is transferred to a FIFO (first-in-first-out) memory 306 by an interface controller 305. The digital data corresponding to exposure doses for a plurality of continuous pixels is transferred in parallel. This parallel signal is divided into the number of bits required for one pixel by the serial signal generator 307, and is transferred to a time-series D/A converter 308 in sync with the reference signal fr. At the D/A converter 308, conversion to analog signals at voltage levels corresponding to digital signals is performed, and the result supplied to the optical modulator driver.

In this way, exposure is performed at prescribed exposure doses for each pixel comprised by the hologram region 201, and through development, a relief-type pattern is formed in the photoresist layer 111. By using the photoresist layer 111 as a mask to etch the glass master plate 108, the pattern of the photoresist layer 111 can be transferred to the glass master plate 108. By this means, a hologram master is obtained.

As has been explained above, by means of this aspect of the invention, a pattern having fine gray scales in the depth direction can be drawn with high precision and in a short amount of time. Here the example of manufacture of a hologram master has been given, but this method is effective when forming a pattern having fine gray scales in the depth direction.

Figure 5:
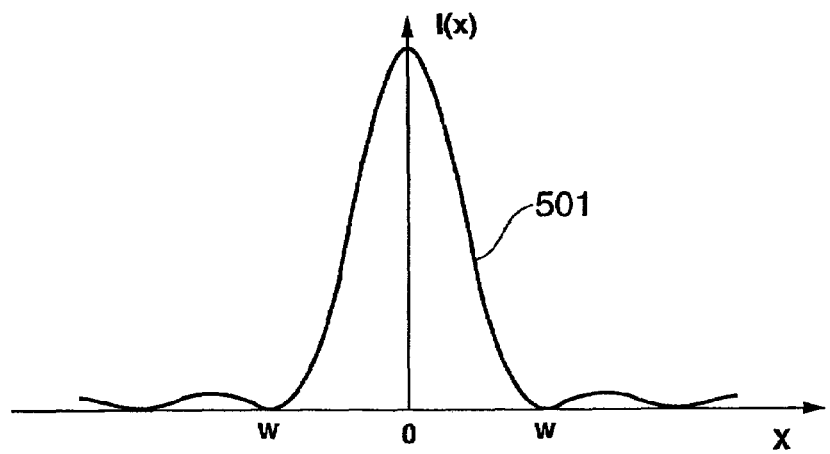
FIG. 5 is the beam profile of a laser spot.

Next, a method is explained for improving the depth precision of the laser spot during laser exposure using the laser patterning device explained in FIG. 1. As shown in FIG. 5, the beam profile I(x) of the laser spot of the laser patterning device is normally as shown by the curve 501. The smallest circle at which the laser intensity is zero is called the Airy disk; its radius w is a value determined by the laser wavelength and by the numerical aperture of the optical system. The definition of the Airy disk is stated in detail on page 76 of Kougaku Gairon II (by Junpei Tsujiuchi, published by Asakura Shoten).

When such a laser spot is used to momentarily expose photoresist and form a single pixel, a resist pattern of shape similar to the beam profile is formed. Ideally, it is desirable that the depth be uniform for each pixel region; hence a rectangular beam profile is desired for the laser spot. However, when the laser spot diameter is made the same order as the laser wavelength, it is in principle impossible to obtain a rectangular beam profile.

Figure 6:
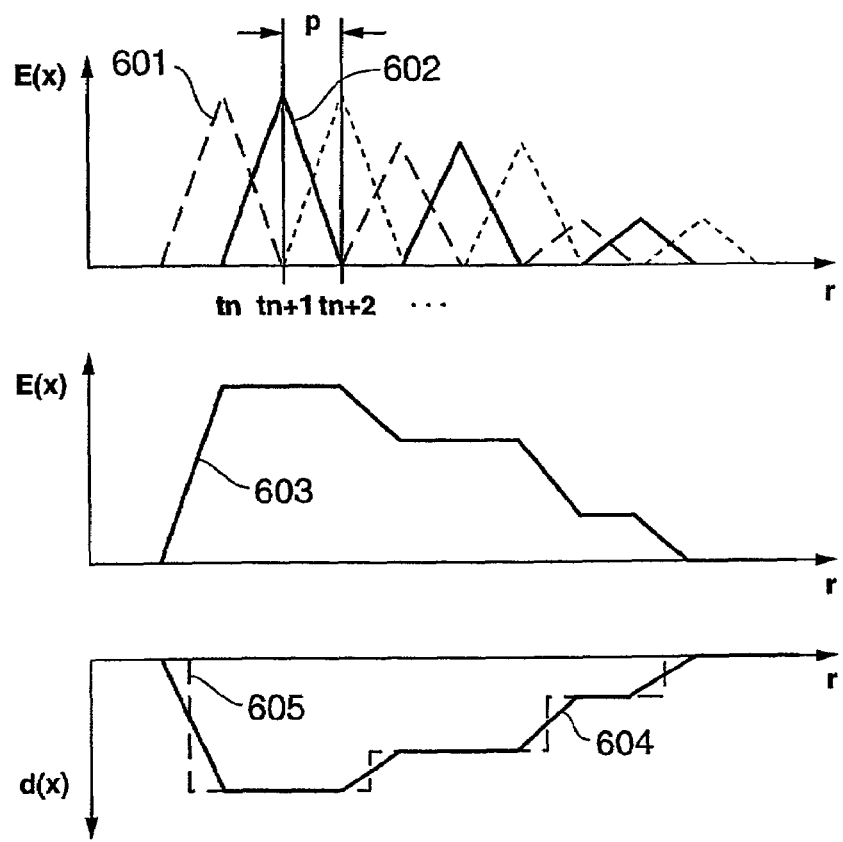
FIG. 6 is a diagram which explains the resist pattern depth and exposure dose distribution.

Hence if, in laser patterning, the distance over which the table 106 advances during the interval of a single revolution of the turntable 109 shown in FIG. 1, that is, the track pitch p, is made equal to the Airy disk radius w of the laser spot, then a nearly ideal exposure distribution is obtained within the hologram region 201 shown in FIG. 2. The principle involved is explained below, referring to FIG. 6. In FIG. 6, the symbols 601, 602 denote beam profiles of the laser spot irradiating the photoresist, 603 denotes the sum total of the exposure distribution resulting from irradiation of the photoresist, 604 is the photoresist depth distribution after development processing, and 605 is the target photoresist depth distribution.

In the figure, the laser spot irradiating the track $t_n$ has the beam profile 601, and the laser spot irradiating the track $t_{n+1}$ adjacent to this has the beam profile 602. In order to simplify the explanation, these beam profiles 601, 602 are represented by approximating the beam profile 501 as a triangular shape.

The track pitch p and Airy disk radius w have been made equal, so that, at the peak position of the beam profile 601, the beam profile 602 is zero, and so the exposure dose at the center of the track $t_n$ is not affected by the beam profile 602 for the adjacent track $t_{n+1}$. Consequently the sum total of the distribution in the radial direction of the exposure dose to which the photoresist is exposed is obtained by connecting the apexes of each of the beam profiles, to obtain the curve denoted by symbol 603.

When this photoresist is developed, the depth distribution of the resist pattern is as indicated by the symbol 604, so that the target depth distribution 605 can be essentially realized. However, the depth changes gradually at the boundaries of each pixel, equivalent to the application of a so-called low-pass filter. For this reason, it is desirable that the track spatial frequency (1/p) be higher than the spatial frequency band required by the depth distribution 604.

As explained above, by making the track pitch p equal to the Airy disk radius w, the depth of the resist pattern to be formed and the exposure dose due to the laser spot are in one-to-one correspondence, so that exposure control is facilitated, and precise processing in the depth direction can be achieved.

Embodiment 2 of the Invention

Figure 11:
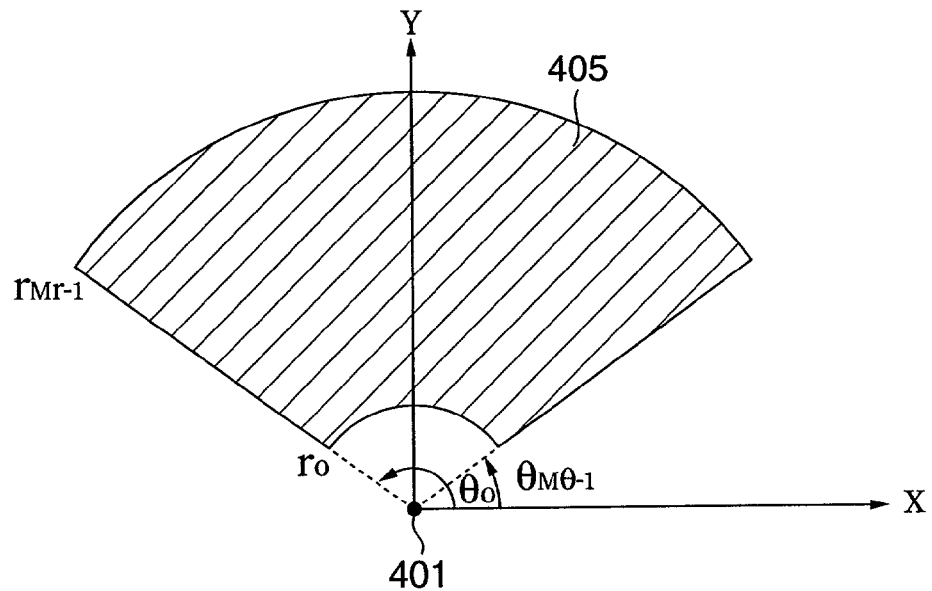
FIG. 11 is a diagram which explains the coordinate system in the drawing region.

The laser patterning device of this aspect of the invention comprises the configuration shown in FIG. 1. Before explaining the laser patterning method of this aspect, the coordinate system for the pattern to be drawn on the drawing region 405 of the glass master plate 108 is explained, referring to FIG. 11. The drawing region 405 is the region enclosed by two arcs centered on the center of rotation 401 of the glass master plate 108, and two straight lines passing through the center of rotation 401. In order to represent the position of the point of drawing, two coordinate systems are used, based on the center of rotation 401. One is an orthogonal coordinate system (XY coordinate system), with the center of rotation 401 as the origin, and with the Y axis set on the straight line passing through the center points of the arcs forming the drawing region 405 and through the center of rotation 401. The other is a polar coordinate system (r$\theta$ coordinate system), in which r is the distance between the center of rotation 401 and the drawing point, and the rotation angle $\theta$ is the angle formed with the X axis by the straight line passing through the drawing point and the center of rotation 401.

Figure 7:
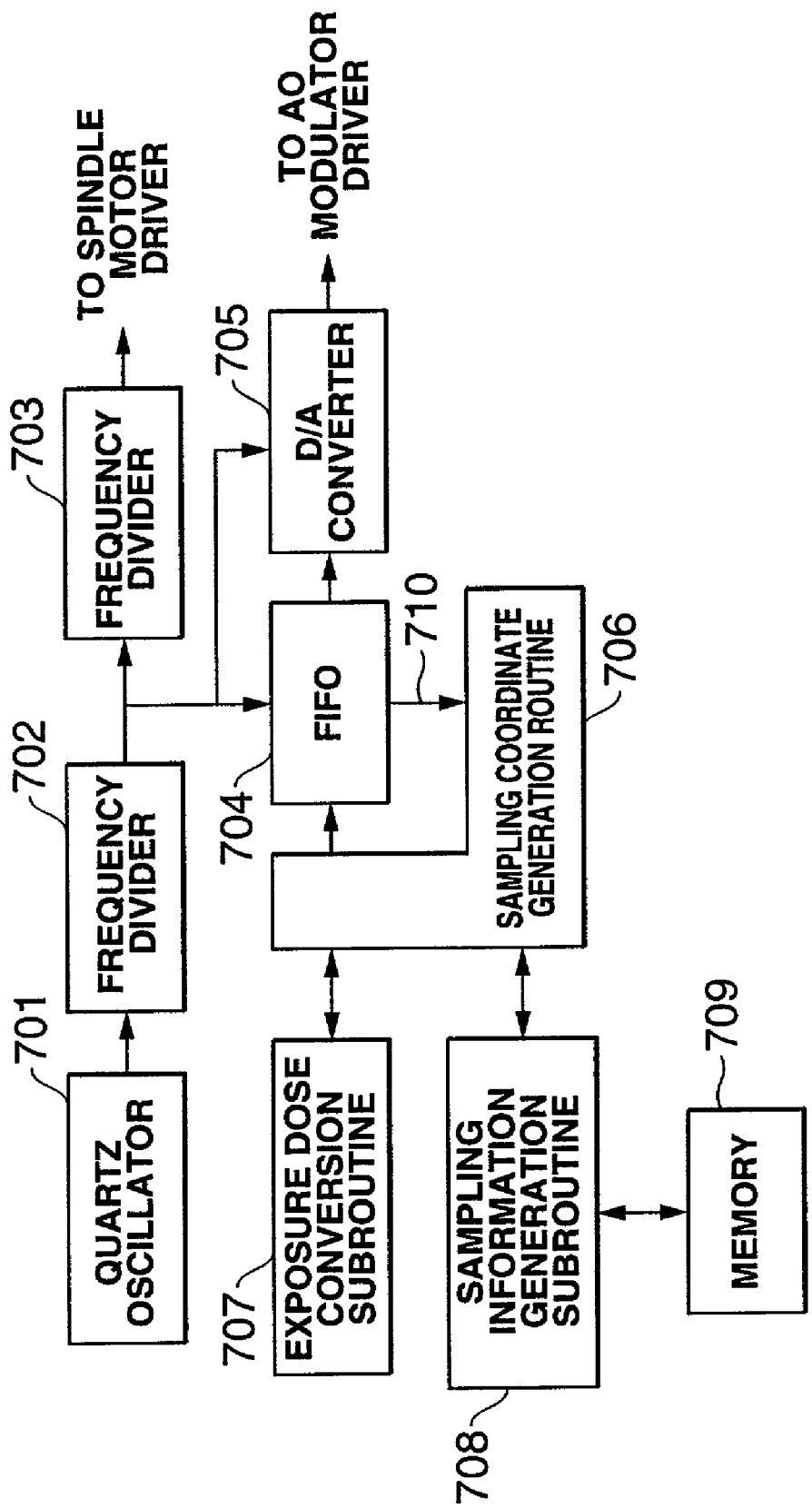
FIG. 7 is a block diagram of the control system of a laser patterning system.

FIG. 7 is a block diagram of the control system of the laser patterning device. In the figure, a signal with fixed frequency output from the quartz oscillator 701 is divided by the frequency divider 702, to become the reference signal determining the timing with which the D/A converter 705 is driven. The D/A converter 705 sequentially reads digital signals from the FIFO memory 704 with the timing of this reference signal, converting them to analog signals with corresponding voltages, for output to the acoustooptical modulator driver as control signals for the acoustooptical modulator 102. The number of bits of the D/A converter 705 is not stipulated in particular, but in this aspect is eight bits. This reference signal is further divided by the frequency divider 703, and supplied to the spindle motor driver to control the rotation rate of the spindle motor 110. In this way, by using a common reference signal to control both the acoustooptical modulator 102 and the spindle motor driver, complete synchronization is possible, and the precision of the drawing position can be enhanced.

When the amount of data remaining within the FIFO memory 704 decreases to less than half of full capacity, an interrupt signal 710 is output to the sampling coordinate generation routine 706. Here it is supposed that half of full capacity of the FIFO memory 704 is equal to SIZE bytes. When the sampling coordinate generation routine 706 receives an interrupt signal 710, exposure dose data in the amount of SIZE bytes is generated. In this aspect, the number of bits of the D/A converter 705 is eight bits, so that exposure dose data is converted into optical intensity modulation signals with 256 gray scales by the D/A converter 705, and is output to the acoustooptical modulator driver.

Figure 8:
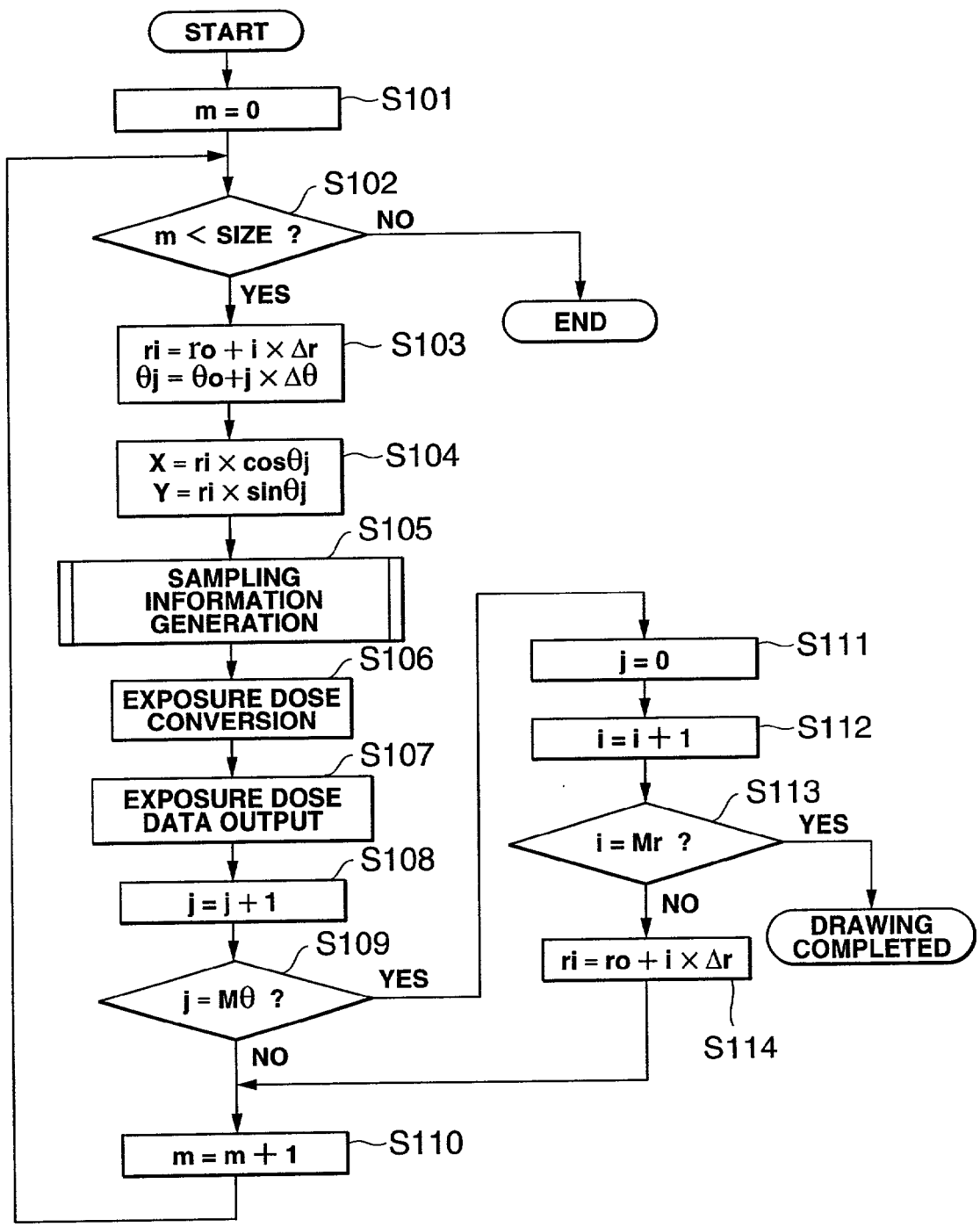
FIG. 8 is a flow chart describing the processing step of the sampling coordinates generation routine.

FIG. 8 shows the processing steps of the sampling coordinate generation routine 706. In the figure, the variable m is a variable used in this processing step to count the number of sampling coordinates for which exposure dose data is to be determined. Exposure dose data for each sampling coordinate is eight bits, and so by repeatedly executing steps S101 through S114 for SIZE number of times, that is, until M=SIZE, exposure dose data is generated sufficient for SIZE bytes.

Here $r_0$ is the starting drawing radius, and $r_i$ is the ith track radius. $\Delta r$ is the interval between adjacent tracks, equivalent to $(r_{i+1}-r_i)$. $\theta_0$ is the rotation angle of the first sampling point for each track, and $\theta_j$ is the rotation angle of the jth sampling point. $\Delta\theta$ is a difference of rotations angles at adjacent sampling points and equivalent to $(\theta_{j+1}-\theta_j)$. i and j are static variables which take the values of zero or of a natural number in the range $0\leq i<Mr$, $0\leq j<M\theta$. i and j are each initialized to zero prior to drawing, and during drawing the values of each are maintained.

When an interrupt signal is supplied to the sampling coordinate generation routine 706, the variable m is initialized to zero (step S101). Next, the values of variable m and of SIZE are compared, and if m<SIZE (step S102; YES), $r_0+i\times\Delta r$ is substituted for $r_i$, and $\theta_0-j\times\Delta\theta$ is substituted for $\theta_j$ (step S103). Here the values of i and j are the values maintained before an interrupt signal was supplied to the sampling coordinate generation routine 706. Next $r_i\times\cos\theta_j$ is substituted for X and $r_i\times\sin\theta_j$ is substituted for Y, to convert polar coordinates into orthogonal coordinates (step S104).

Figure 9:
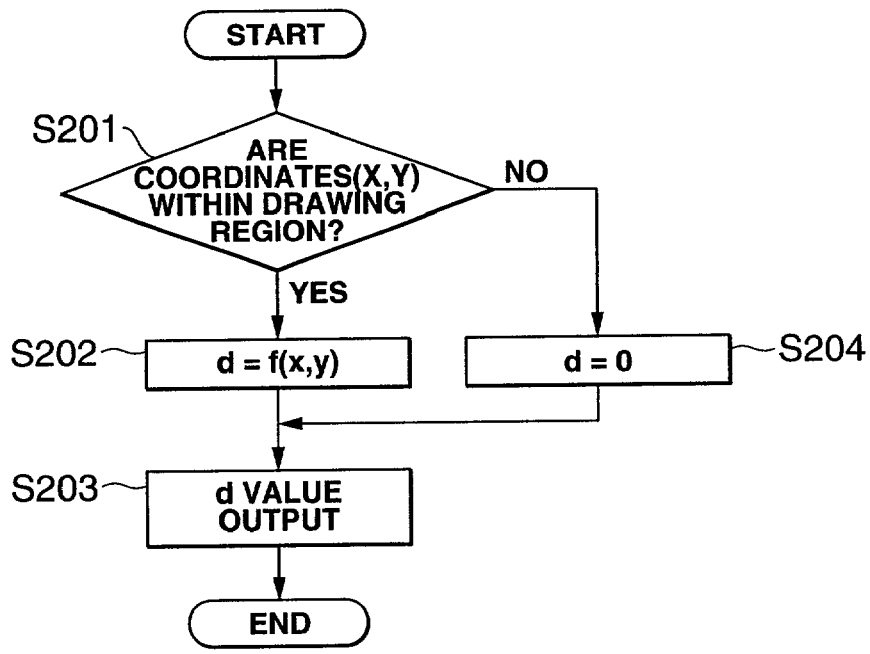
FIG. 9 is a flow chart describing the processing step of the sampling information generation subroutine.

Next the sampling information generation routine 708 is called, and data proportional to the depth of the latent image in the photoresist (hereafter called depth data) is generated (step S105). As shown in FIG. 9, in the sampling information generation routine 708, first a judgment is made as to whether the sampling point, converted into orthogonal coordinates, is positioned within the drawing region 405 (step S201). If the sampling point (x,y) is positioned within the drawing region 405 (step S201; YES), depth data is acquired from the function f(x,y) and is substituted into the variable d. The function f(x,y) is a function for determining, through arithmetic operations, depth data for each sampling point.

In this way, even if the amount of depth data is an enormous amount of data overall, a configuration is adopted in which depth data is determined by calculations during drawing operation, so that there is no need to store depth data in advance in a storage device (for example, an external storage device), and the configuration of the laser patterning device can be simplified. If too much time is required for depth data calculations, the depth data may instead be stored in advance in memory 709, and may be referenced during drawing to perform drawing operations. On the other hand, if a sampling point is not positioned within the drawing region 405 (step S201; NO), "0" is substituted for the variable d (step S204). The value of the variable d is then output (step S203).

Figure 10:
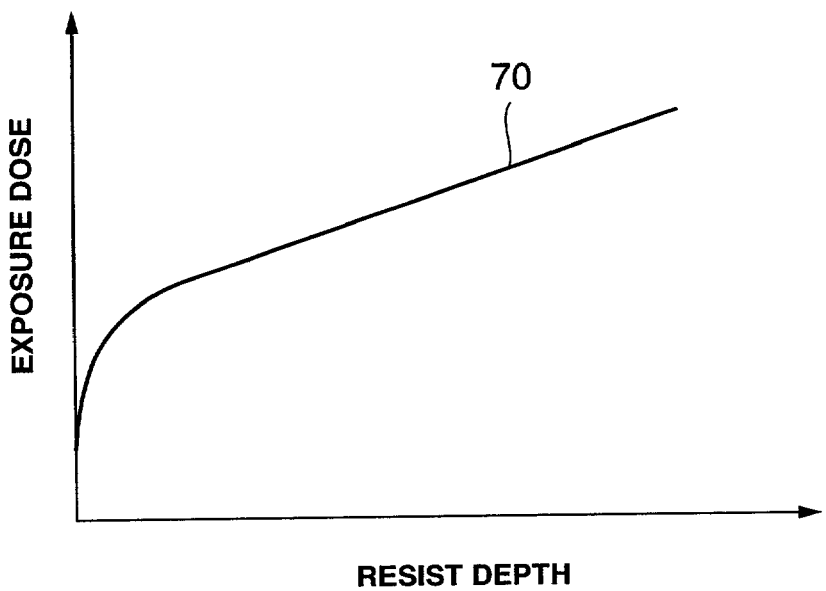
FIG. 10 is a graph showing the relation between resist depth and exposure dose.

Next, the exposure dose conversion subroutine 407 is called, and exposure dose conversion is performed (step S106). Normally when using positive-type photoresist, the formed latent image is dissolved in the development process, and concave shapes are formed on the photoresist surface with depth corresponding to the depth of the latent image. Because the latent image depth depends on the exposure dose, the depth of concave shapes formed on the photoresist surface depends on the exposure dose. FIG. 10 shows the relation between resist depth and exposure dose. The curve 70 is a photosensitive characteristic curve indicating the exposure doses corresponding to resist depths. In the exposure dose conversion subroutine 707, the photosensitive characteristic curve 70 is used to determine the required exposure dose data from the depth data (values of the variable d), and this is output to the FIFO memory 704 (step S107). Exposure dose conversion processing may be configured to record depth data and exposure dose data in advance in a table format in memory, for later referencing, or may perform calculations based on an approximating equation representing the characteristic curve.

Next, the value of j is incremented by one (step S108), and if the value of j does not coincide with the value of Mθ (step S108; NO), the value of m is incremented by one (step S110), and execution returns to step S102. If the value of j coincides with the value of Mθ (step S108; YES), 0 is substituted for j (step S111), and the value of i is incremented by one (step S112). Here, if the value of i does not coincide with Mr (step S113; NO), the value of $r_0+i \times r$ is substituted for $r_i$ (step S114), and execution proceeds to step S110. If the value of i coincides with Mr (step S113; YES), drawing is terminated.

As explained above, in the laser patterning device of this aspect, by preparing various types of sampling information generation subroutines, diverse patterns can be drawn. And because drawing is possible while rotating the turntable 109 at high speed, arbitrary patterns can be drawn with high speed and precision compared with conventional XY table-type laser patterning devices.

In the above explanation, a configuration was shown in which the laser light 112 is modulated by the acoustooptical modulator 102; but a semiconductor laser can also be used as the laser light source. In this case, optical modulation is possible using the semiconductor laser itself, and the acoustooptical modulator 102 becomes unnecessary.

Figure 12:
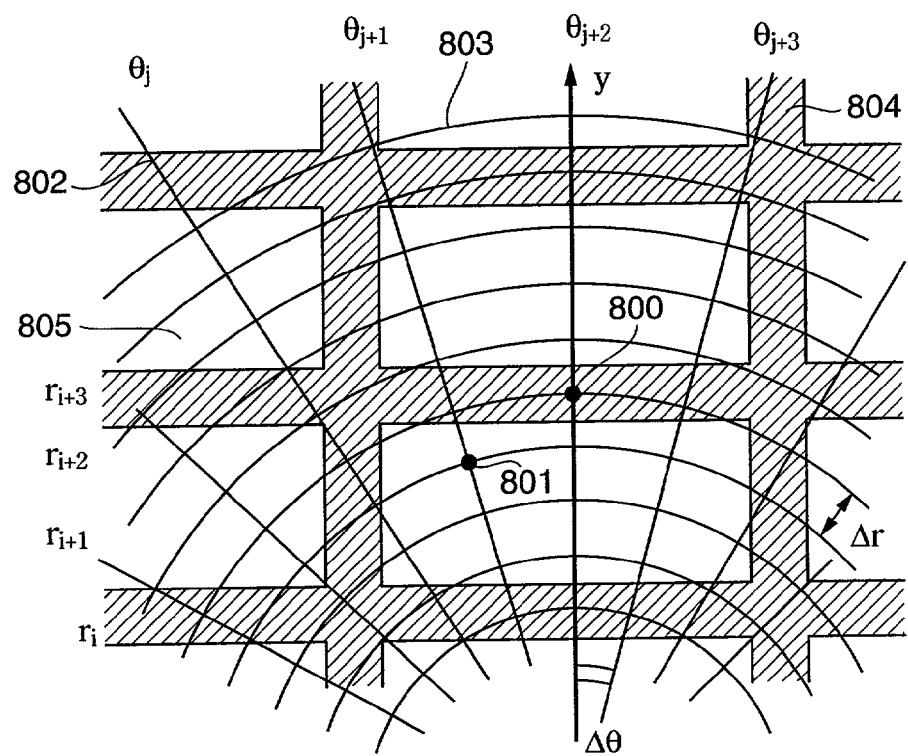
FIG. 12 is a diagram which explains the drawing pattern.

Next, a drawing method is explained which is configured such that the drawing pattern involves periodic repetitions of a basic pattern. Here the case of formation of a lattice-shape pattern in the photoresist, like that shown in FIG. 12, in the drawing region 405 of the glass master plate 108 is explained. In the figure, the sampling points are the points of intersection of straight lines passing through the center of rotation 401 of the glass master plate 108, as typified by the straight line 802, and tracks as typified by the track 803 (for example, the points of intersection 800, 801).

Figure 13:
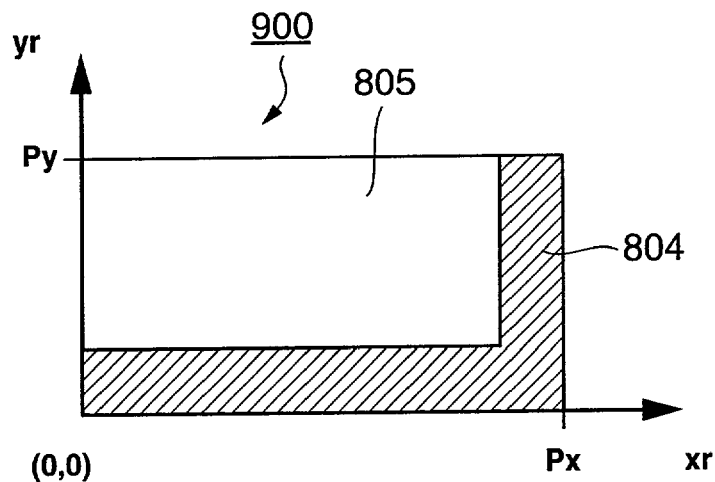
FIG. 13 is a diagram which explains the basic pattern.

The lattice-shape pattern exhibits periodicity, and the basic pattern is shown in FIG. 13. Here, one period of the lattice-shape pattern is referred to as a cell 900. Coordinates within the cell 900 can be expressed as relative coordinates (xr, yr). Px is the period in the xr axis direction, and Py is the period in the yr axis direction. The cell 900 has two types of region. The region denoted by the symbol 804 is not exposed, and photoresist remains in place; it is called the cell frame. The region denoted by the symbol 805 is exposed in order to form a concave shape; it is called the cell interior.

Figure 14:
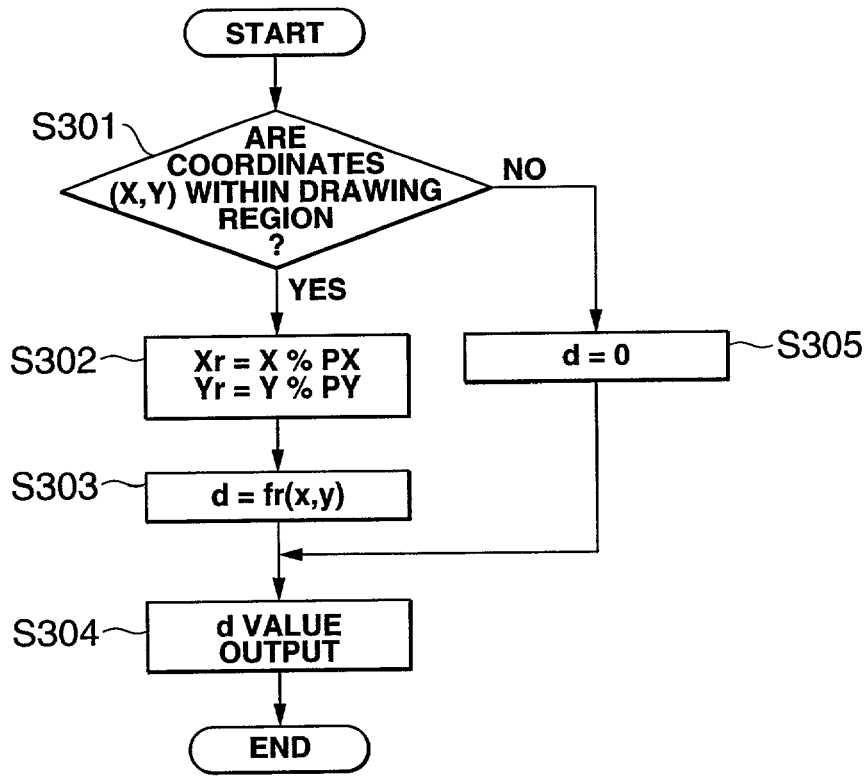
FIG. 14 is a flow chart describing the processing step of the sampling information generation subroutine.

The basic method used when drawing a periodic basic pattern like that above is the same as the method already explained; only the sampling information generation subroutine 708 is different. FIG. 14 shows the processing flow of the sampling information generation subroutine 708 when drawing such a periodic basic pattern. In the subroutine, first, when the sampling point (x,y) is positioned within the drawing region 405 (step S301; YES), the coordinates (x,y) are converted into relative coordinates (xr, yr) (step S302). Concretely, the remainder when x is divided by Px is taken to be xr, and the remainder when y is divided by Py is taken to be yr.

Next, depth data is obtained from the function fr(xr,yr), and is substituted into the variable d (step S303). The function fr(xr,yr) is a function used to determine by calculation the depth data for each sampling point. In order to obtain the depth data for each sampling point, in addition to the method of using the function fr(xr,yr), depth data for individual sampling points may be stored in memory in advance. On the other hand, if the sampling point (x,y) is not positioned within the drawing region 405 (step S301; NO), execution advances to step S304. In step S304, the value of the variable d is output.

As explained above, when the drawing pattern comprises a repeated periodic basic pattern, because a sampling information generation subroutine like that shown in FIG. 14 is provided, depth data can be generated rapidly through simple calculations and using a small amount of memory. The basic pattern is not limited to a lattice shape; a similar technique is possible for any arbitrary shape having periodicity. Although this explanation has been given for patterns having binary depths of a cell frame 804 and cell interior 805, formation of complex patterns having three or more depth values is also possible.

By narrowing the track interval Δr or by reducing Δθ, the sampling density can be increased, enabling drawing of an ideal pattern. In order to reduce Δθ, either the rotation rate of the turntable 109 can be slowed, or the frequency of the output signal of the frequency divider 202 and the processing speed of the sampling information generation subroutine 208 can be increased.

However, in actuality there are limits to increases in sampling density, and drawing errors occur in the redirection intervals Δr and θ-direction intervals AO in actually drawn patterns. Hence by setting $\Delta r = Py/n$ in the case of a pattern having periodicity, and with period Py in the yr direction, the effective drawing precision in the yr axis direction can be improved. For example, in the case of the lattice-shape pattern shown in FIG. 12, focusing only on the yr axis direction, a single cell can be drawn in four tracks. That is, by setting $\Delta r = Py/4$ the cell frame 804 can be drawn at every four tracks, for improved drawing precision.

Figure 15:
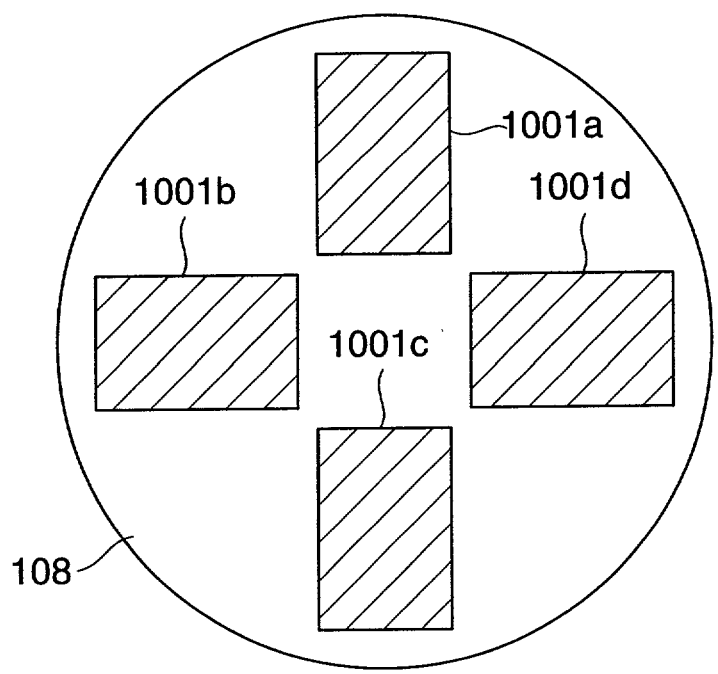
FIG. 15 is a diagram which explains the formation of a plurality of identical drawing patterns.

In the above explanation, an example has been given for the case in which a single pattern is drawn on the glass master plate 108; by performing four irradiations of the same laser pulse train during the interval in which the glass master plate 108 makes a single revolution, the regions 1001*a*, 1001*b*, 1001*c*, 1001*d* can be drawn in one operation with the same pattern, as shown in FIG. 15. If irradiation employs different pulse trains as necessary, a plurality of different patterns can be drawn in one operation. It is possible to make this time for drawing equal to the time required to draw a single pattern 1001*a*, and so the drawing time per pattern can be shortened.

Embodiment 3 of the Invention

Next, the hologram master of this aspect of the invention is explained.

Figure 16:
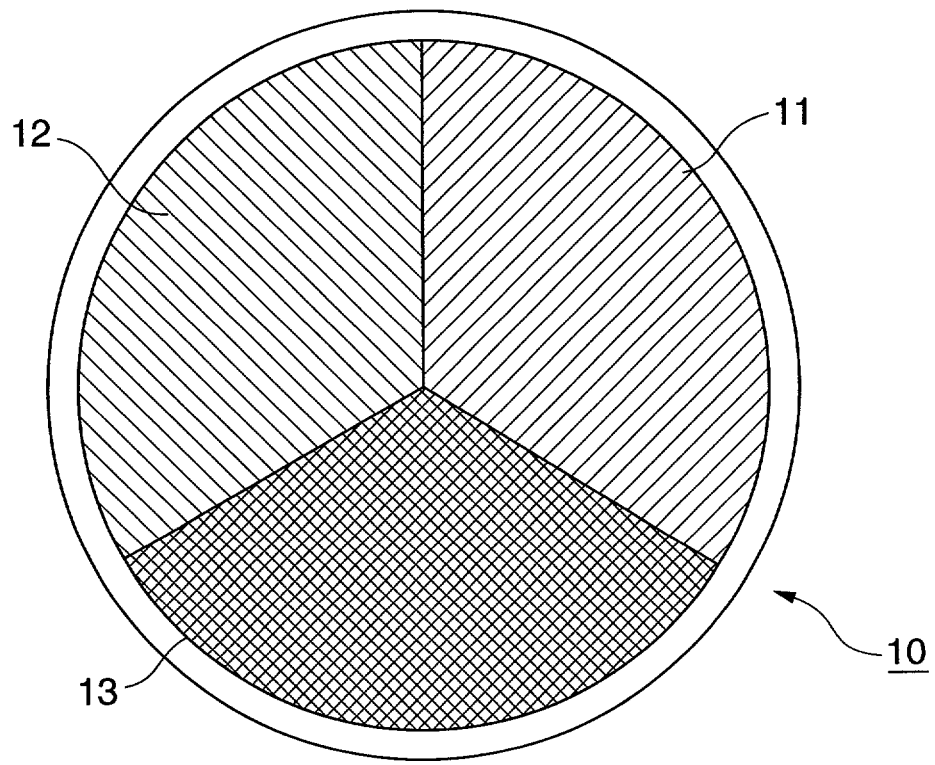
FIG. 16 is a plane view of a hologram master of this invention.
Figure 18:
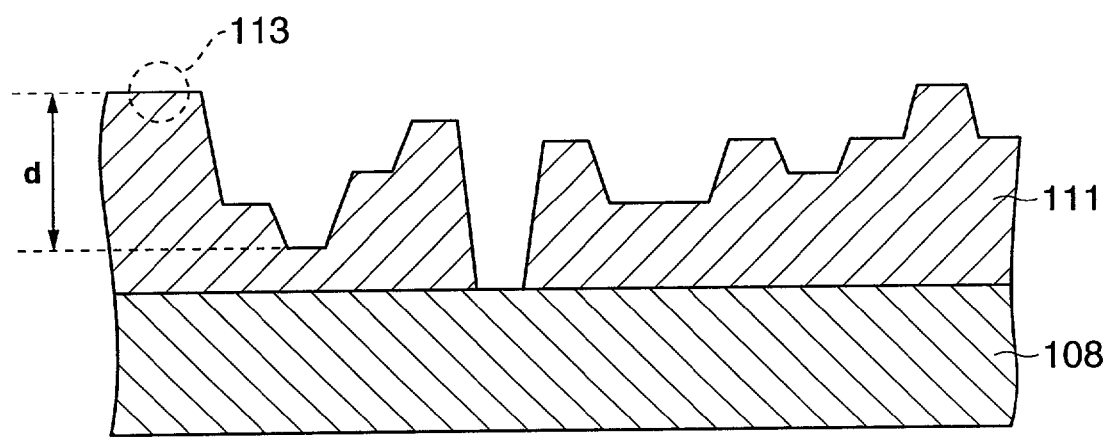
FIG. 18 is a cross-sectional view of a hologram master of this invention.

FIG. 16 is a plane view of the hologram master; FIG. 18 is a cross-sectional view of the hologram master. As shown in FIG. 16, the hologram master 10 comprises a plurality of hologram regions 11, 12, 13 in order to reproduce images obtained by analyzing a color three-dimensional image into color components. It is assumed that the hologram regions 11, 12, 13 reproduce red, green, and blue images, respectively. Each of these hologram regions forms a fan shape, the central angle of which is 120°.

As shown in FIG. 18, the hologram master 10 comprises photoresist 111 applied to the top of a glass master plate 108; the photoresist 111 comprises numerous pixels of varying depths. Pixels are obtained by exposing the photoresist to laser light, and then developing. At this time, by varying the exposure dose the pixel depth can be adjusted. A hologram having such an uneven shape is called a relief-type hologram. In the figure, the symbol 113 denotes a pixel the depth d of which is zero.

Figure 17:
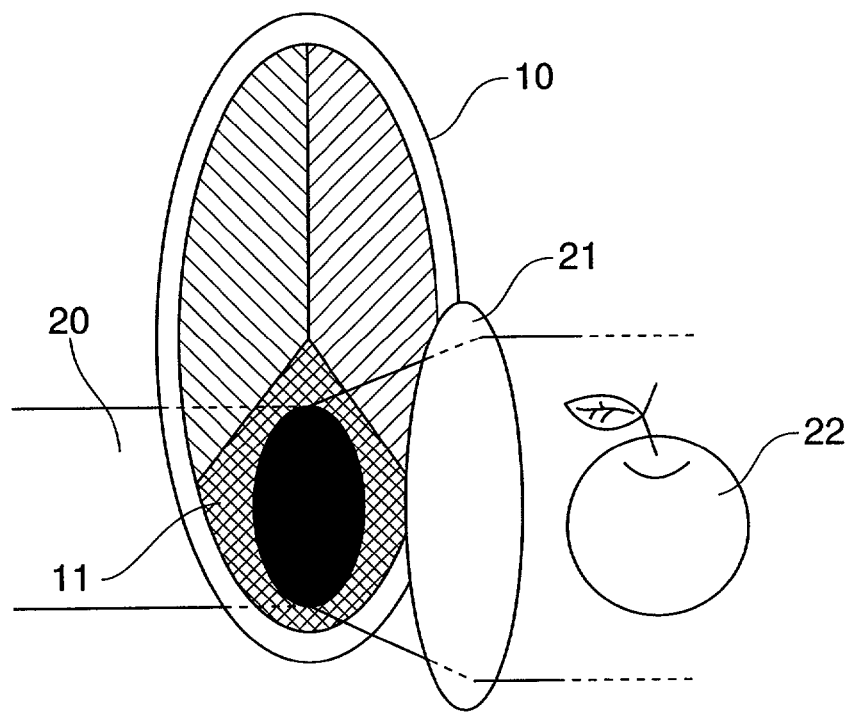
FIG. 17 is a diagram which explains the reproduction of an image using a hologram master of this invention.

In order to reproduce the image of the hologram master 10, each of the hologram regions 11, 12, 13 is irradiated with laser beams 20 of the corresponding colors, as shown in FIG. 17. Each pixel produces a phase difference in the transmitted beam according to the depth d, forming a wave front which reproduces the image. With pixels 113 of depth d=0 as reference, the phase difference Δϕ (rad) resulting from modulation is given by the following formula.

$$\Delta\phi = 2\pi d(n-1)/\lambda$$

Here n is the refractive index of the photoresist 111, and λ (nm) is the wavelength of the laser beam 20. On irradiating the hologram region 11 with a red laser beam 20, the laser beam 20 undergoes phase modulation in the hologram region 11, is condensed by the lens 21, and reproduces an image of the red component of the image of an apple 22 which was the object. Similarly, on irradiating the hologram regions 12, 13 with green and with blue laser beams 20, images of the green and blue components are reproduced.

The maximum value of the pixel depth d occurs when Δϕ is 2π in the region 11 which reproduces the red image. If the wavelength of the red laser beam 20 is 633 nm and the refractive index n of the photoresist 111 is 1.60, then from the above equation, the maximum value of d is 1.06 μm.

By forming the photoresist 111 into a relief shape, a hologram master 10 is obtained. However, it is also possible to form relief-shape photoresist 111 on quartz substrate, then use this photoresist 111 as a sacrificial layer in etching in order to transfer the relief shape of the photoresist 111 to the quartz substrate, to manufacture the hologram master.

A reflective layer may also be provided on the surface of the photoresist 111, to form a reflective-type hologram.

Figure 19:
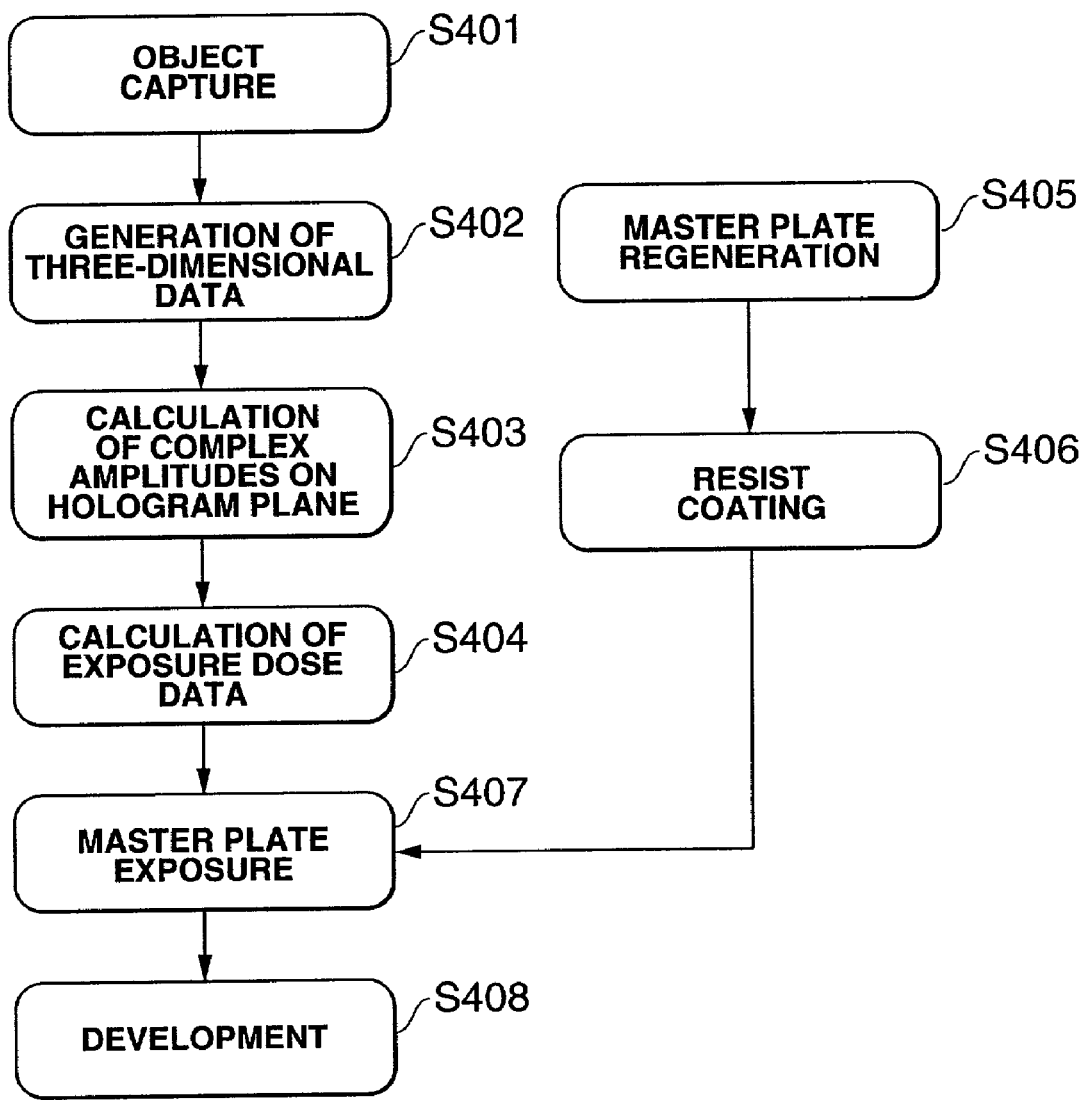
FIG. 19 is a flow chart describing manufacturing processes for the hologram master of this invention.

Next, the method of manufacture of the above hologram master 10 is explained, referring to FIG. 19. First the object is captured from a plurality of directions (step S401), and a computer is used to calculate depth data for each pixel comprised by the image of the object, to generate data for the three-dimensional image (step S402). In place of steps S401 and S402, computer graphics technology may be used to generate data for a suspended three-dimensional image. Next, this three-dimensional image is analyzed into images for each of the color components red, green and blue, and by subjecting these to FFT or diffraction integration, the complex amplitude distribution on the face of the hologram master 10 is calculated (step S403).

Here, by increasing the distance between the reproduced image and the hologram master face, the amplitude distribution becomes nearly constant, and it is sufficient to focus only on the phase distribution. When this phase distribution is generated in orthogonal coordinates (XY coordinates), it is converted into polar coordinates (rθ coordinates). Depths are calculated such that the required phase differences occur for each of the pixels comprised by this phase distribution, and the exposure dose data required to obtain these depths is calculated (step S404).

The glass master plate 108 is precisely polished and washed to regenerate the master plate (step S405). Next, photoresist is spin-coated onto the surface of the glass master plate 108 (step S406), and the glass master plate 108 is exposed (step S407).

In exposure of the glass master plate 108, the laser patterning device shown in FIG. 1 is used. The wavelength of the gas laser used as the light source is determined by the spatial frequency, that is, the resolution, required for fabrication of the hologram master 10; in this aspect of the invention, a violet laser of wavelength approximately 400 nm is used. The spot size of the laser beam when condensed at the diffraction limit by an objective lens 105 is, for a numerical aperture of 0.9, approximately 0.5 μm. The laser light 112 emitted from the gas laser passes through the electrooptical modulator 103, and then passes through the acoustooptical modulator 102. The exposure dose data generated in step S404 is converted into a voltage level for each pixel, and this is used as a control signal for sequential input to the electrooptical modulator 103.

The electrooptical modulator 103 utilizes the photoelastic effect of an acoustooptical element, and is capable of modulating the laser light 112 according to an input control signal. After passing through the acoustooptical modulator 102, the laser light 112 is reflected by mirrors 101, 104, condensed by the objective lens 105, and forms a laser spot on the photoresist 111 on the glass master plate 108, already processed in steps S405, S406. The glass master plate 108 is fixed in place by suction on the turntable 109, and rotates under a driving force from the spindle motor 110.

The table 106 moves from inner to outer circumferences of the glass master plate 108 as time passes, to expose the hologram region. Each of the pixels comprised by the hologram region by a single pulse of laser light within one rotation, or, if the size of the laser spot is small compared with the pixel, may be formed by a plurality of pulses during a plurality of rotations.

Thereafter, by developing the glass master plate 108, a hologram master 10 in relief shape is formed in the photoresist 111. When the photoresist 111 applied to the glass master plate 108 is of the positive type, upon development the exposed parts are dissolved and a concave pattern is formed; the greater the exposure dose, the deeper is the pattern. Hence in order to increase the phase differences among pixels, the differences in exposure doses irradiating pixels must be made large.

As explained above, by means of this aspect of the invention the laser spot is moved linearly in the radial direction while rotating the glass master plate 108 to effect exposure, enabling reduction of the time required for the exposure process.

The phase distribution on the hologram master 10 can be calculated by a computer, and based on this data a hologram master 10 precisely fabricated, and by transferring the reproduction image to a photographic plate 60, Lippmann-type holograms can be easily mass-produced without any constraints on the object size.

By forming the hologram regions 11, 12, 13 of the three primary colors on a single disk, it is easy to position the hologram master 10 in the process of transferring the reproduced image to a photographic plate 60.

Figure 20:
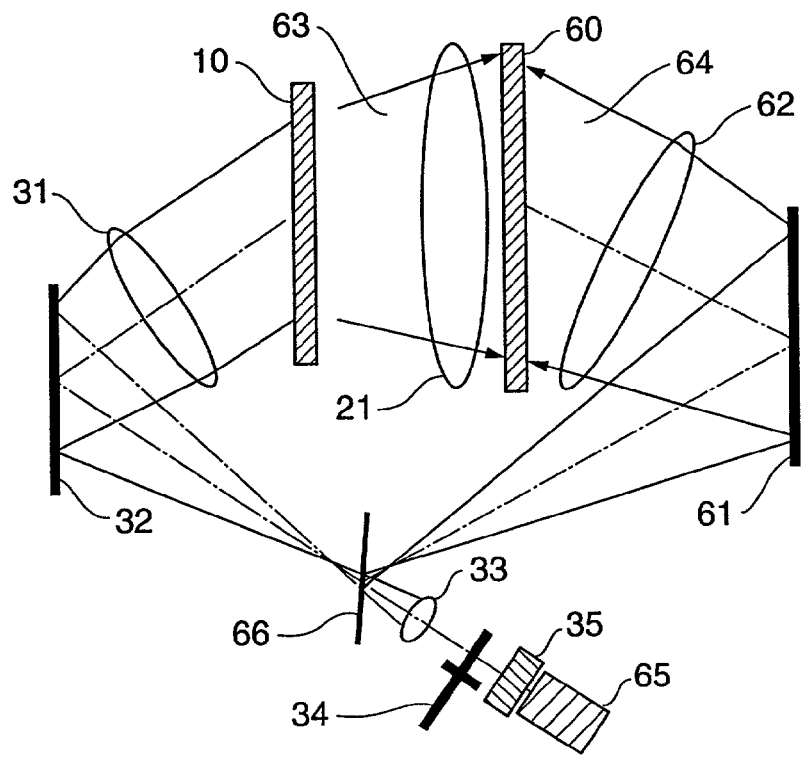
FIG. 20 is a diagram which explains recording of a hologram using a hologram master of this invention.

Next, the method of manufacture of holograms of this aspect is explained, with reference to FIG. 20. The laser beam emitted from a white-light laser 65 passes through a shutter 35 before reaching the color filter 34. The color filter 34 forms a disk shape, and comprises, within the disk shape, color filters for the three primary colors red, green, and blue. The laser beam emitted from the white-light laser 65 has the components of the three primary colors, and by rotating the color filter 34, the wavelength of the laser beam passing through this filter can be switched.

After passing through the color filter 34, the laser beam is condensed by the objective lens 33 and divided by the half-mirror 66; part arrives at the mirror 32, the other part arrives at the mirror 61. The laser beam reflected by the mirror 32 is rendered into a parallel beam by the collimating lens 31, reaches the hologram master 10, undergoes spatial phase modulation, and becomes a wave front forming the reproduced image of the object. The hologram master 10 is obtained by the fabrication method described above. On passing through the hologram master 10, the image of the laser beam is enlarged by the lens 21, and reaches the photographic plate 60 as a signal wave 63.

On the other hand, the laser beam reflected by the mirror 61 is rendered into a parallel beam by the collimating lens 62, and reaches the photographic plate 60 as the reference wave 64. The recording material layer of the photographic plate 60 is a volume hologram of thickness several tens of times greater than the wavelength; the interference fringes of the signal wave 63 and reference wave 64 are recorded as variations in density or as changes in refractive index.

This exposure operation is performed a total of three times, for the red, green and blue colors, by rotating the color filter 34 and hologram master 10. The interference fringes for the three primary color components are recorded, superposed, on the photographic plate 60. Thereafter, the photographic plate 60 is developed as necessary, to complete the hologram. When reproducing the image, natural light is irradiated from the same direction as the reference wave 64 with respect to the photographic plate 60, and a color three-dimensional image of the object floats above the photographic plate 60.

Figure 21:
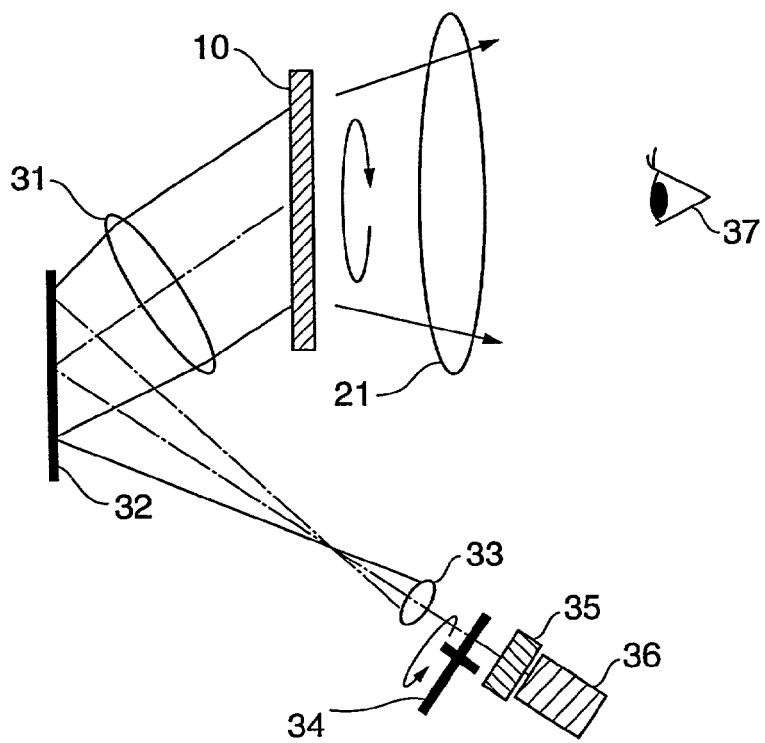
FIG. 21 is a diagram which explains a display device to reproduce images using a hologram master of this invention.
Figure 22:
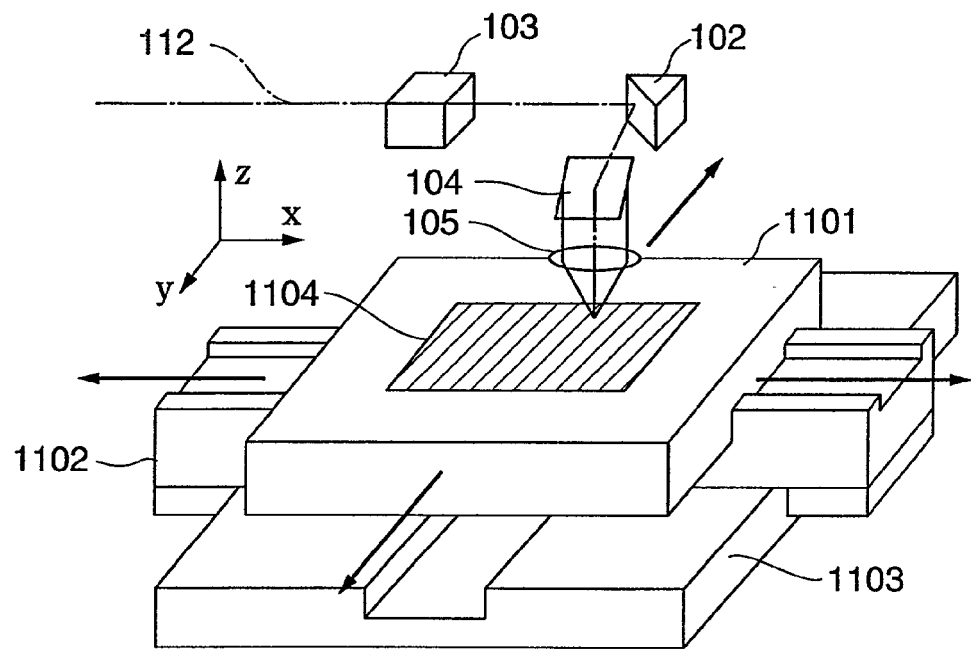
FIG. 22 is a diagram of the configuration of a conventional laser patterning device; and, FIG. 23 is a diagram which explains a conventional Lippmann-type hologram.
Figure 23:
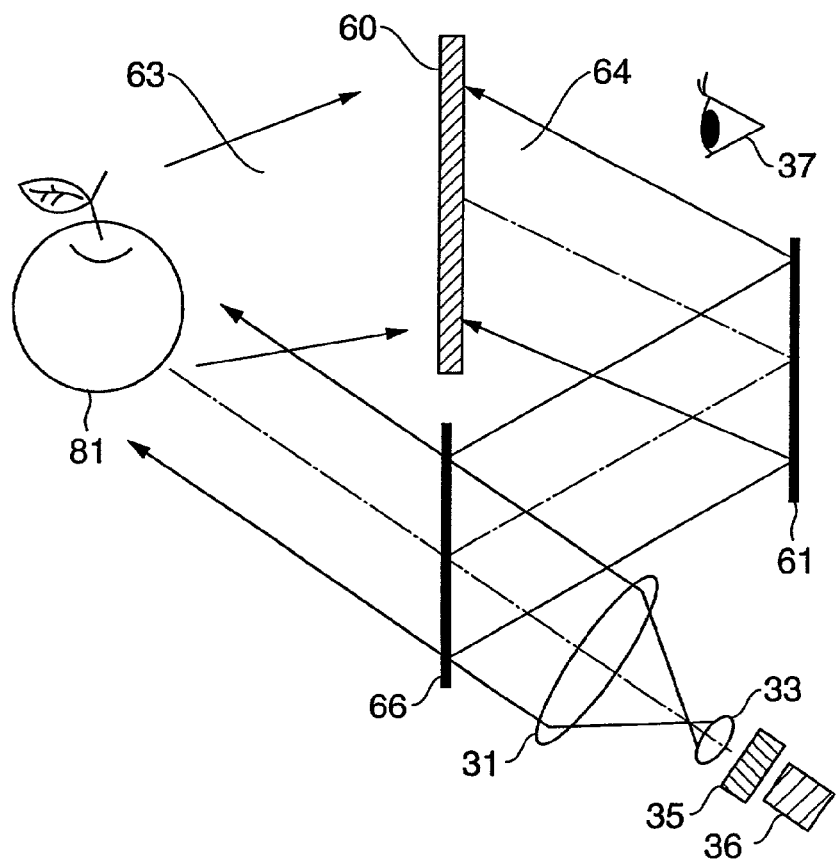

Next, the display device of this aspect is explained with reference to FIG. 21. A laser beam emitted from a white-light laser 36 passes through a shutter 35, to arrive at the color filter 34. This color filter 34 forms a disk shape and comprises, within the disk shape, color filters for the three primary colors red, green, and blue. The laser beam emitted from the white-light laser 65 has the components of the three primary colors, and by rotating the color filter 34, the wavelength of the laser beam passing through this filter can be switched.

After passing through the color filter 34, the laser beam is condensed by the objective lens 33 and reflected by the mirror 32, then rendered into a parallel beam by the collimating lens 31 and arrives at the hologram master 10. The hologram master 10 is obtained by the fabrication method described above.

The color filter 34 and hologram master 10 are rotated at the same rotation rate; when the laser beam emitted by the white-light laser 36 passes through the red filter of the color filter 34, the red hologram region of the hologram master 10 is irradiated, and is synchronized such that the red image is reproduced. In the cases of the green and blue hologram regions similarly, the color filter is synchronized such that green and blue images are reproduced.

The shutter 35 is also opened and closed in sync with the rotation of the hologram master 10, and is configured such that when the hologram master regions 11, 12, 13 are at appropriate positions, the shutter 35 is opened. If the rotation rate of the hologram master 10 is set to approximately 30 rotations per second, the observer 37 does not sense any flicker due to the opening and closing of the shutter 35, and can observe a color three-dimensional image.

In this way, by directly viewing the image reproduced from the hologram master 10, a distinct three-dimensional image can be obtained. Because the direction of incidence of the reference wave on the hologram master 10 is fixed, there is no need to adjust the direction of incidence of the reference wave.

What is claimed is:

1. A laser patterning device, comprising a turntable on which a process member is placed and which rotates the member, a linear slider, a laser serving as light source, an optical system mounted on said slider to condense the laser light and form a laser spot on said member, and an optical modulator to vary optical intensity of said laser spot; which rotates said processed member by means of said turntable, and moves the optical system mounted on said slider while performing laser patterning of a prescribed pattern on said processed member.

2. The laser patterning device according to claim 1, comprising a formatter, comprising an oscillator which generates a reference signal in order to synchronize the rotation rate of said turntable and the control signals of said optical modulator; a storage device to record digital data corresponding to the output values of the control signals of said optical modulator; and a converter for conversion of said digital signals into analog signals.

3. A laser patterning device, comprising a turntable on which a process member is placed and which rotates the member, a linear slider, a laser serving as light source, an optical system mounted on said slider to condense the laser light and form a laser spot on said member, and an optical modulator to vary optical intensity of said laser spot; which rotates said processed member by means of said turntable, and moves the optical system mounted on said slider while performing laser patterning of a prescribed pattern on said processed member wherein the distance of which said optical system moves on the slider while said turntable rotates once is set to be equal to the radius of the Airy disk of said laser spot.

4. A laser patterning method, wherein a processed member is rotated, and laser light is moved linearly to perform laser patterning of a prescribed pattern on said processed member.

5. The laser patterning method according to claim 4, wherein said processed member is placed on a turntable and rotated; and optical system mounted on a linear slider is moved linearly and causes laser light to move along the linear direction of the slider; and laser patterning is performed in a prescribed pattern on said processed member, while an optical modulator changes the laser light intensity.

6. The laser patterning method according to claim 5, wherein the driver of said turntable is driven based on a reference signal generated by an oscillator; digital data recorded in a storage device is converted into analog signals and supplied to said optical modulator based on the reference signal; and the rotation rate of said turntable is synchronized with the control signals of said optical modulator.

7. A laser patterning device, comprising a turntable on which a process member is placed and which rotates the member, a linear slider, a laser serving as light source, an optical system mounted on said slider to condense the laser light and form a laser spot on said member, and an optical modulator to vary optical intensity of said laser spot; which rotates said processed member by means of said turntable, and moves the optical system mounted on said slider while performing laser patterning of a prescribed pattern on said processed member wherein the distance over which said optical system moves linearly along said slider while said turntable rotates once is made equal to the radius of the Airy disk of said laser spot.

8. A laser patterning device, comprising a turntable on which a processed member is placed and which rotates the member; a linear slider; a laser serving as a light source; an optical system, mounted on said slider, to condense the laser light to form a laser spot on said processed member; sampling coordinate generation means which generates sampling coordinates while sequentially modifying the radius from the center of rotation of said turntable and the rotation angle; sampling information generation means which generates sampling information corresponding to specific physical quantities representing the state at the position of said sampling coordinates; and exposure control means to control the exposure does of said laser spot based on said sampling information.

9. The laser patterning device according to claim 8, wherein said sampling information generation means generates sampling information by calculations from said sampling coordinates at the time of drawing operation.

10. The laser patterning device according to claim 8, wherein the sampling information generation means comprises storage means to store, in a relative coordinate system, sampling information comprised by a prescribed basic pattern when the drawing pattern comprises repetitions of said basic pattern, and relative coordinate conversion means to convert said sampling coordinates into relative coordinates; and, which reads and outputs the sampling information, based on relative coordinates, from said storage device.

11. The laser patterning device according to claim 10, wherein the amount of advance of the slider during a single rotation of said turntable is made equal to an integral fraction of unity of said basic pattern to draw the basic pattern.

12. The laser patterning device according to claim 8, wherein the same laser pulse train is irradiated a plurality of times during a single rotation of said processed member, and the same drawing pattern is formed a plurality of times on the processed member.

13. A laser patterning device, comprising a turntable on which a processed member is placed and which rotates the member; a linear slider; a laser serving as a light source; and optical system, mounted on said slider, to condense the laser light to form a laser spot on said processed member; sampling information generation means which generates sampling information corresponding to specific physical quantities representing the state at sampling coordinate positions, while sequentially changing the radius from the center of rotation of said turntable and the rotation angle; exposure dose conversion means to perform conversion into exposure dose information corresponding to the exposure does necessary to change from said sampling information to the state of said physical quantities, based on the photosensitive characteristic curve of said processed member; and exposure dose control means to control the exposure dose of said laser spot on said exposure does information.

14. A laser patterning method, wherein the processed member is placed on a turntable and rotated and an optical system mounted on a linear slider is moved to cause laser light to move along the slider; sampling coordinates are generated while sequentially changing the radius from the center of rotation of the turntable and the rotation angle; sampling information corresponding to specific physical quantities is generated representing the state and sampling coordinate positions; and, laser patterning of a prescribed pattern is performed on said processed member while changing the exposure does of the laser spot based on the sampling information.

15. The laser patterning method according to claim 14, wherein sampling information is generated by calculation from said sampling coordinates at the time of drawing operation.

16. The laser patterning method according to claim 14, wherein, when the drawing pattern comprises a repetition of a prescribed basic pattern, sampling information comprised by the basic pattern is stored in a storage device in advance in relative coordinates, said sampling coordinates are converted into relative coordinates, and sampling information is read and output from said storage device based on the relative coordinates.

17. The laser patterning method according to claim 16, wherein the amount of advance of the slider during a single rotation of said turntable is made equal to an integral fraction of unity of said basic pattern to drawing the basic pattern.

18. The laser patterning method according to claim 14, wherein the same laser pulse train is irradiated a plurality of times during a single rotation of said processed member, and the same drawing pattern is formed a plurality of times on the processed member.

19. A laser patterning method, wherein the processed member is placed on a turntable and rotated and an optical system mounted on a linear slider is moved to cause laser light to move along the slider; sampling information is generated corresponding to specific physical quantities representing states at sampling coordinate positions while sequentially changing the radius from the center of rotation of the turntable and the rotation angle; conversion into exposure dose information is performed corresponding to the exposure dose necessary to change from said sampling information to the state of said physical quantities, based on the photosensitive characteristic curve of said processed member; and, laser patterning of the prescribed pattern is performed on said processed member, controlling the exposure dose of said laser spot based on said exposure dose information.

20. A hologram master for reproducing a color three-dimensional image of an object, wherein a plurality of hologram regions with interference fringes, formed by interference between an object wave and a reference wave, recorded therein by a color component are placed on the same hologram surface.

21. The hologram master, according to claim 20, wherein said color components are red, green, and blue.

22. The hologram master according to claim 20, wherein said substrate is a disk.

23. The hologram master according to claim 20, wherein said plurality of hologram regions are placed on a circular area.

24. The hologram master according to claim 20, wherein the material of said substrate is either glass, quartz, or metal.

25. The hologram master according to claim 20, wherein photosensitive material whose shape, transmissivity, reflectivity, refractive index, or other optical characteristic changes spatially is formed on the surface of the substrate.

26. A hologram, fabricated by transferring onto hologram recording media an image reproduced on the basis of the hologram master according to claim 20.

27. A hologram manufacturing method, which performs fabrication by transferring onto hologram recording media the image reproduced on the basis of the hologram master according to claim 20.

28. A display device, comprising the hologram master according to claim 20; means for rotating the hologram master; light sources in color corresponding to said hologram regions; and means for irradiating hologram regions with beams emitted from light sources in corresponding colors, to reproduce color three-dimension images.

29. A hologram master manufacturing method, wherein a photosensitive material is applied to a substrate, and the photosensitive material is exposed and developed to form, on said photosensitive material, a plurality of hologram regions with interference fringes, formed by interference between an object wave and a reference wave, recorded therein by a color component.

30. The hologram master manufacturing method according to claim 29, wherein said photosensitive material is used as a sacrificial layer, and the pattern formed in the photosensitive material by etching is transferred to, said substrate.

31. The hologram master manufacturing method according to claim 29, wherein laser light is moved linearly while rotating a substrate on which is applied said photosensitive material, and said hologram regions are formed by drawing a pattern having numerous gray scale levels in the depth direction while changing the optical intensity of the laser spot formed on said photosensitive material.

32. The hologram master manufacturing method according to claim 29, wherein, as the exposure equipment performing said exposure processing, a laser patterning device is used comprising a turntable to rotate a substrate coated with photosensitive material, a slider which is capable of moving linearly, a laser serving as a light source, an optical system mounted on said slider and which condenses the laser light to form a spot on the layer of said photosensitive material, and an optical modulator which changes the optical intensity of said laser spot, to draw an arbitrary pattern.

* * * * *

UNITED STATES PATENT AND TRADEMARK OFFICE
CERTIFICATE OF CORRECTION

PATENT NO.        : 7,027,381 B1
APPLICATION NO.   : 09/707217
DATED             : April 11, 2006
INVENTOR(S)       : Kimio Nagasaka et al.

It is certified that error appears in the above-identified patent and that said Letters Patent is hereby corrected as shown below:

Col. 8, line 2: "M=SIZE" should be -- m=SIZE --

Col. 8, line 18: "$\Theta_o - jx\Delta$" should be -- $\Theta_o + jx\Delta\Theta$ --

Col. 9, line 12: "$r_o + ixr$" should read -- $r_o + i\Delta r$ --

Col. 10, line 24: "redirection" should be -- r-direction --

Col. 10, line 25: "AO" should be -- $\Delta\Theta$ --

Col. 15, line 14: "does" should be -- dose --

Col. 15, line 51: "does" should be -- dose --

Col. 15, line 55: "does" should be -- dose --

Col. 15, line 66: "does" should be -- dose --

Col. 16, line 16: "drawing" should be -- draw --

Col. 17, line 2: "dimension" should be -- dimensional --

Signed and Sealed this

Sixth Day of March, 2007

JON W. DUDAS
*Director of the United States Patent and Trademark Office*